United States Patent [19]
Dietz et al.

[11] Patent Number: 5,362,568
[45] Date of Patent: Nov. 8, 1994

[54] PRE-FIRE WARNING SYSTEM AND METHOD USING A PERFLUOROCARBON TRACER

[75] Inventors: Russell N. Dietz; Gunnar I. Senum, both of Patchogue, N.Y.

[73] Assignee: Associated Universities, Inc., Washington, D.C.

[21] Appl. No.: 68,664

[22] Filed: May 27, 1993

Related U.S. Application Data

[63] Continuation-in-part of Ser. No. 836,244, Feb. 18, 1992, abandoned.

[51] Int. Cl.$^5$ .............. B32B 21/18; G01N 31/12; G01M 3/04; C08K 5/02
[52] U.S. Cl. .................. 428/421; 73/40.7; 252/408.1; 374/57; 524/462; 524/463
[58] Field of Search ........... 524/462, 463; 428/421; 436/3, 7; 252/408.1; 374/57; 73/40.7

[56] References Cited

U.S. PATENT DOCUMENTS

| | | | |
|---|---|---|---|
| 3,955,417 | 5/1976 | Smith et al. | 436/7 |
| 4,151,764 | 5/1979 | Meier et al. | 436/7 |
| 4,179,926 | 12/1979 | Philips et al. | 436/7 |
| 4,273,674 | 6/1981 | Ligon, Jr. et al. | 436/7 |
| 4,399,226 | 8/1983 | Danielson et al. | 252/408.1 |
| 4,493,207 | 1/1985 | Dempsey | 73/40.7 |
| 4,520,157 | 5/1985 | Yannopoulos et al. | 524/462 |
| 4,588,643 | 5/1986 | Schmidt et al. | 428/421 |
| 4,715,985 | 12/1987 | Pean et al. | 252/408.1 |
| 4,725,551 | 2/1988 | Thompson | 73/40.7 |

FOREIGN PATENT DOCUMENTS

| | | | |
|---|---|---|---|
| 7204753 | 11/1972 | Netherlands | 436/7 |

*Primary Examiner*—Peter Szekely
*Attorney, Agent, or Firm*—Margaret C. Bogosian

[57] ABSTRACT

A composition and method for detecting thermal overheating of an apparatus or system and for quickly and accurately locating the portions of the apparatus or system that experience a predetermined degree of such overheating. A composition made according to the invention includes perfluorocarbon tracers (PFTs) mixed with certain non-reactive carrier compounds that are effective to trap or block the PFTs within the composition at normal room temperature or at normal operating temperature of the coated apparatus or system. When a predetermined degree of overheating occurs in any of the coated components of the apparatus or system, PFTs are emitted from the compositions at a rate corresponding to the degree of overheating of the component. An associated PFT detector (or detectors) is provided and monitored to quickly identify the type of PFTs emitted so that the PFTs can be correlated with the respective PFT in the coating compositions applied on respective components in the system, thereby to quickly and accurately localize the source of the overheating of such components.

6 Claims, 2 Drawing Sheets

PRE-FIRE WARNING SYSTEM AND METHOD USING A PERFLUOROCARBON TRACER

This invention was made with Government support under contract number DE-ACO2-76CH00016, between the U.S. Department of Energy and Associated Universities, Inc. The Government has certain rights in the invention.

This application is a continuation-in-part of co-pending application U.S. Ser. No. 836,244, filed Feb. 18, 1992, now abandoned.

BACKGROUND

The invention is related to a method and apparatus for protecting components of electrical or electronic systems from being damaged due to overheating of thermally degradable materials, including electronic components and wiring insulation. More generally, the invention is also useful to monitor and indicate overheating conditions that may occur in non-electrical systems. In addition to providing a very sensitive indication of destructively high temperature levels in a monitored system, the invention provides a practical means for readily localizing the areas of a monitored system where overheating has occurred. More particularly, in certain arrangements of the invention, such a localizing function is achieved by using different perfluorocarbon tracers (PFTs) to monitor discrete portions of a system. Such PFTs are mixed and formed into suitable carrier compounds, such as compounds that result form mixing predetermined volumes of PFTs with selected volumes of insulating paints, elastomeric films, or polymeric support materials, which can then be readily applied to form insulating and thermal monitoring coatings around electrical wiring or electronic components of a system. In the operation of such a monitored system, when the system is in a normal temperature range the PFTs remain trapped within the carrier materials of the carrier compositions, but when predetermined portions of the wiring or coated components become overheated such overheating causes an unusually high level of PFT vapor to be emitted from the compositions into the surrounding environment. To complete the monitoring system, one or more conventional PFT detectors are positioned in that ambient environment and are selected to be operable to indicate the type of PFTs that are emitted from given sections of wiring or from a given coated component, thereby to identify and localize the overheated portion of the system.

The problems associated with undesirable overheating of electrical insulation or other portions of electrical systems or other apparatus are common and long standing ones. These problems are particularly common in electrical or electronic systems that are subjected to unregulated overcurrent conditions, and that also susceptible to insulation breakdown and failure due to normal aging of the constituents of the insulating compositions used in the systems. For example, it is well known in the prior art to provide a wide variety of thermal breakdown indicators for monitoring electrical apparatus or components that are covered with protective coatings subject to such breakdown. Such prior art systems typically use thermoparticulating materials that breakdown into small flakes or particles, such as smoke particles, when certain pre-determined temperatures are exceeded within a coated component or apparatus. Examples of such particulating over-heat indicator compositions are shown in U.S. Pat. Nos. 4, 179,926 and 4,151,746. Those patents also describe use of the compositions in a manner such that they provide means for indicating the relative location within a system of a coating in which overheating has occurred.

Such thermo-particulating indicating systems have several disadvantages relative to indicators that emit essentially a particulate free and essentially a gaseous vapor at predetermined temperatures. Particulates evolved from such prior art indicator compositions are not transported as efficiently as gas vapors in the ambient gas stream around the monitored components or apparatus. Because such particulates are heavier than the ambient gases, they settle out of the gases and thus often do not reach associated monitoring detectors in the same efficient concentrations that are realizable with a gaseous-vapor overheat indicator. Moreover, the types of detectors used with such thermo-particulate indicator systems are normally either ion chamber detectors, such as those used in conventional household smoke detectors, or they may be condensation nucleic counters, which cannot discriminate between the type of thermo-particulate used as an indicator and any other particulate that may be in the ambient, such as dust particles or smoke from sources other than the monitored electrical apparatus. Thus false readings or undesired indications are often obtained from such particulate indicators.

For certain narrow fields of application, such as use within the hydrogen cooling systems of electrical generators of the type described in the two above-mentioned patents, the ambient system within the containment housings is not so susceptible to producing misleading indications, because no dust or random ambient particles are permitted within such hermetically sealed cooling systems. However, that susceptibility of the particulate-type of indicators to produce false or misleading readings, caused by particulates introduced into the ambient from sources beyond the monitored system, would be a significant detriment if such indicators were to be applied in unenclosed areas that inherently are subject to exposure to dust, random smoke or other foreign particulates. An important distinction between such prior art particulate-indicating systems and the present invention is that many thermo-particulate indicating systems are not suitable for use in an environment that exposes humans to the type of particulates that are necessarily emitted from such a monitored insulator coating. On the other hand, the gaseous vapors emitted from the PFT carrier compositions of the present invention have been documented as being safe with respect to inhalation and ingestion potential toxicity to humans. A further important distinction between such prior art particulate-indicating systems and the present invention is that many thermo-particulate indicating systems employ a thermo-particulating compound which has a decomposition temperature in the range of 100° C. or greater, whereas the increase in gaseous vapors emitted from the PFT carrier compounds are such that they are readily detectable at the much lower temperatures.

A subsequently issued U.S. Pat. No. 4,204,428 discloses a thermo-particulating coating system in which an attempt is made to compensate for the non-discriminating nature of an associated condensation nucleic counter detector. In that system a thermo-particulate is collected then chemically dissolved, extracted and chemically analyzed for specific chemical components that are indicative of each type of coating used in the monitoring system. A gas chromatograph is used for making the analyzes. Rather than utilize such an inherently complex indicating and monitoring arrangement, the present invention avoids the use of a particulate system entirely, in favor of using readily identifiable essentially particulate free and essentially chemical vapors that are selectively emitted from predetermined compositions as a function of the compositions becoming over-heated at certain critical temperature levels.

SUMMARY OF THE INVENTION

In the preferred embodiment of the invention disclosed herein a pre-fire or thermal over-heat indicator system that uses perfluorocarbon tracer (PFT) indicator gases is provided for indicating and localizing areas of an electrical or electronic apparatus or other systems that are coated with either insulating compositions, or with protective coating compositions, in which the PFT gases are locked or entrapped when the compositions are maintained at or below the normal operating temperatures of the coated apparatus or components. Different types of PFT materials are used to form suitably different indicating compositions, which in turn are readily applicable to monitor designated portions of an insulated or protectively coated apparatus or system. In operation, when portions of such a coated apparatus or system become heated to a critical temperature that is in excess of the normal operating temperature for the system, PFT gases are emitted from the coating compositions as a consequence of such overheating. An associated PFT detector and analyzer are positioned in the ambient of the coated apparatus or system and are operable to identify the particular PFT gases or vapors that are emitted. Accordingly, the locations of an over-heated component can be quickly and accurately determined by so using the present invention.

A primary object of the present invention is to provide a pre-fire or thermal-overheating indicator system that uses perfluorocarbon tracers in blocking or trapping carrier compositions that hold the PFTs within the compositions until they are exposed to a predetermined critical level of heating, at which point the PFTs are emitted and detected by an associated detector(s) positioned in an ambient gas or gas stream. Such a detector is capable of identifying the particular type of PFT gas or gases thus emitted, so that different areas of the over-heated system can be easily identified, as a function of the particular PFT gases that are emitted from the given compositions which have been applied, respectively, to discrete designated areas of the system.

Another object of the invention is to provide a thermal overheating indicator system that uses essentially a indicator gas or gases, rather than using a thermo-particulating indicator, thereby to provide an extremely sensitive indicator means that is not susceptible to dilution by having major portions of the emitted indicator gas settle away from the associated gas detector(s).

A further object of the invention is to provide an extremely sensitive and commercially practical thermo-overheat indicator system that uses PFT gases to identify certain over-heated areas of the system, and that is not limited by the above-noted shortcomings of particulate-detector type overheat indicating systems.

Yet another object of the invention is to provide a thermo-overheating indicator and indicator system having perfluorocarbon tracer emission rates that rise very rapidly in response to over-heat conditions, and that have a blocking or trapping constituent of the composition that is effective to provide an estimated lifetime for the effective over-heat indicating phase of the PFT gases that is at least several years in duration.

Additional objects and advantages of the invention will become apparent to those skilled in the art from the description of it presented herein.

DESCRIPTION OF THE PREFERRED EMBODIMENTS

Figure 1A:
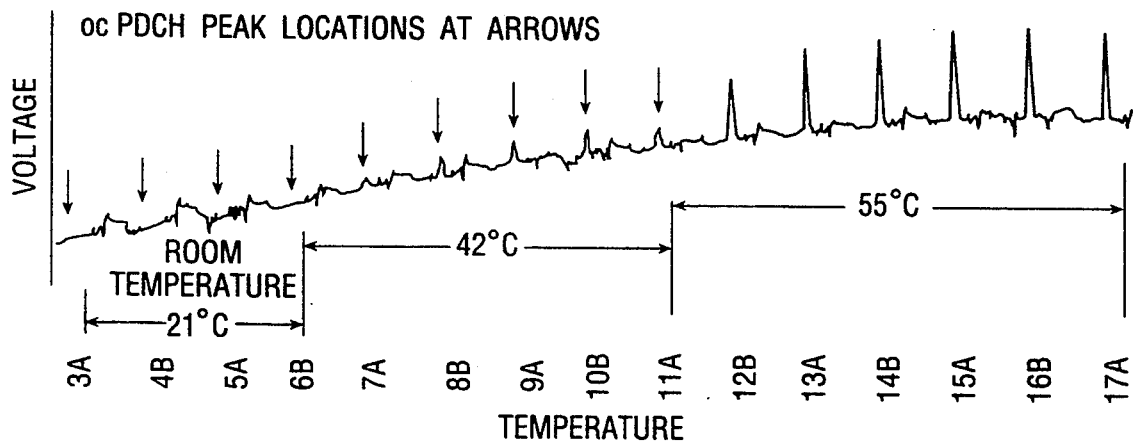
FIGS. 1A, 1B, and 1C of the drawing are a series of chromatograms that show successively higher ranges of temperatures to which compositions containing PFT materials were subjected thereby to cause PFT gases to be emitted from the compositions as a controllable function of such temperature increases. Discernible ocPDCH peaks are identified with arrows, shown adjacent the lower temperature range of the chromatogram, i.e. in the range from the designated "room temperature" up through the 42° C. temperature illustrated.

Long before conceiving and developing the present invention, its inventors engaged in numerous projects that employed perfluorocarbon tracer materials in various large scale atmospheric, hydrologic and subsurface applications. In those applications the PFT technology has proven to be very useful in detecting and measuring leaks of oil from underground electrical cables, as well as for detecting and measuring flows of air and other gases within building structures and in outdoor atmospheres. The present relatively mature state of the PFT technology applications has resulted in the development and commercial availability of extremely sensitive PFT detectors, which are capable of accurately identifying very small concentrations of a number of different PFT gases or different PFT gases. With such commercial detectors, multiple PFTs can be used to identify and localize emission of a PFT gas, or different PFT gases, from different areas of a monitored system. In all known earlier applications of PFT gases, the tracer gases were injected into either a fluid or liquid medium, rather than being locked or trapped in a fixed relationship within an insulating or protective coating or carrier composition. In other words, the PFT gases in such earlier known systems moved with a fluid or liquid that was either freely moving in a monitored enclosure or that was leaking from a fluid or liquid system being monitored. The inventors are not aware of any earlier uses of PFTs to provide a pre-fire or thermal overheat indicator apparatus or method such as that disclosed herein.

The present invention was conceived and developed when the inventors recognized that PFTs can be trapped or blocked for suitably long periods of time within several different coating or carrier compositions, and then can be caused to be emitted from those compositions as a direct and predetermined function of the degree of heating applied to the compositions. By experimenting with a number of different coating or carrier composition materials it was found that desirably sensitive PFT thermal overheat indicator compositions can be constructed so that very little PFT gas is emitted from the compositions at normal room temperatures, while desirably large volumes of PFT gases are emitted from such compositions when they are subjected to critical elevated temperatures that might eventually result in the thermal degradation or destruction of the insulating or coating properties of the compositions and that might result in degradation of the associated electronic components. Thus, it was recognized that a very desirable pre-fire warning composition and method could be made to provide early warning of pre-char stages of thermal overheat degradation of selected PFT trapping or blocking compositions. It was also found that by using different PFTs it is possible to readily detect and precisely localize the areas of any such monitored pre-char overheating, so that an operator can take appropriate remedial action to forestall further damage to those areas of a system that are monitored by using the PFT compositions of the invention.

The perfluorocarbon tracer technology is a multi-tracer technology, i.e., up to seven different tracer compounds can be simultaneously deployed, sampled and analyzed in a discriminating detector, such as a gas chromatograph. This multiplicity of tracers allows a binary coding of the tracer compounds that can then be used to localize the electrical or electronic components by coating the respective components with unique mixtures of the several different PFTs. This makes it possible to localize an overheated component or components at far more than seven locations. For example, two, three, four or more of the basic seven PFTs can be mixed to form combinations of mixtures, thereby to theoretically enable localization of $2^7$ sites, i.e., up to 128 different sites or coated locations.

These sensitive PFT indicators are particularly desirable for applications in electrical or electronic systems such as those used in space-exploration vehicles or shuttles, or in advanced medical equipment, where high levels of reliability are essential and where even partial thermal degradation of insulating or coating systems can be particularly damaging to the safety or successful use of such apparatus. It will also be recognized from the following description of the invention that it can be equally useful in more common environments such as in the electrical insulation systems used for house wiring or for electrical generating or transmission apparatus or for electric power utilizing appliances.

In practicing the present invention a preselected class of liquid, non-toxic, fully fluorinated hydrocarbons is dissolved in a selected carrier material that is useful for either electrically insulating or protectively coating an apparatus or component that may be subjected to overheating. The resulting composition is then applied to the apparatus by being coated thereon and is allowed to cure, thereby to trap the PFTs in their desired monitoring positions. A sensitive PFT gas detector is also positioned at a suitable location relative to the PFT composition-coated apparatus to monitor the ambient gases or gas stream around the apparatus. The inventors have found that a variety of different insulating or coating composition materials can be used as carrier materials to effectively trap or block the PFT liquids within the compositions. For example, such PFT materials have been successfully mixed in suitable commercially available insulating paints, and have been solubilized into suitable commercially available elastomeric films and coating compositions. Also, micro-emulsified PFT liquids have been successfully incorporated into suitable commercially available polymeric composition coating materials. As is shown by the following examples, when such a desirably tagged composition-coated component undergoes excessive overheating, i.e., heating to a pre-determined critical temperature beyond its normal operating range, the perfluorocarbon tracer (PFT) materials are emitted as a vapor into the surrounding environment, where they are detected by the suitably positioned PFT detector (or detectors), thereby to provide an indication or warning of the overheat condition.

Alternatively, instead of coating the various components or apparatus with the resulting composition of a selected carrier and PFT, a thermal PFT overheat indicator can be fabricated by dissolving in a selective carrier material a PFT tracer and allowing the resulting composition to cure in the form of a thin sheet or film so as to entrap or lock in the PFTs in the carrier. Subsequently the film can be attached or affixed to the component or apparatus to be monitored.

The following examples are given by way of illustrating the desirable features of the present invention, and are not to be construed as limiting either the concept or application of the invention. The examples are intended to enable those skilled in the art to more readily understand and practice the invention.

EXAMPLE I

A suitable commercially available glyptal insulating paint (Glyptal 1201 red enamel commercially available from Glyptal, Inc. of Chelsea, Mass.) was tagged with 0.013% ocPDCH, a selected perfluorocarbon tracer (PFT) (Flutec PP3A, Batch 51360 commercially available from Imperial Chemical and Smelting Co., of Princeton, N.J.), by the addition of 96 microliters of 10% PP3A (weight/weight) in hexane to 20 grams of Glyptal paint. A two centimeter wide strip of that tagged Glyptal paint composition was painted onto a 150-Ohm, 10-watt, resistor (Clarostat, VC1OF), which had a vitreous enamel coating that is heat resistant and impermeable to the tagged Glyptal paint composition. The total surface area of the resistor that was painted with the Glyptal paint composition was 5.7 cm$^2$ and the composition had a maximum dried (i.e. after one overnight drying) weight of about 22.4 milligrams. The maximum ocPDCH concentration in the dried Glyptal paint composition was 0.014% (3.1 micrograms ocPDCH total) assuming no loss during the drying. A day later the tagged Glyptal-composition-painted resistor was placed in a glass sampling tube over which a one liter per minute flow of a 5% hydrogen, 95% nitrogen gas mixture was passed. Voltage was applied to the resistor by a Variac and was measured with a conventional multimeter. The resistor temperature was monitored by an attached thermocouple. The outlet of the glass sampling was fed into a suitable conventional dual-trap analyzer (DTA) for PFT analyzes of samples collected for six minutes at a flow rate of 240 milliliters per minute, for a total sample of 1.44 liters. It should be understood that the chemical composition of Glyptal paint comprises an alkyled based resin, a xylene solvent system, and an iron oxide pigment, mixed in suitable proportions to achieve the liquidity and color desired for a given use. If further detail for a particular glyptal paint is desired, it may be obtained from the manufacturer Glyptal, Inc. of Chelsea, Mass.

As is shown in FIG. 1A, in the portion of the horizontal scale designated "room temperature," virtually no discernible ocPDCH peaks can be seen in the depicted chromatogram (adjacent the arrows) of the first five analyzes that were performed at room temperature (i.e. about 21° C.), compared with those peaks that are clearly present when the temperature of the PFT-tagged electrical resistor component used in the test was raised to about 42° C., as such peaks are designated by the vertical arrows in the region of the chromatogram labelled "42° C. The chromatograms shown in FIGS. 1A, 1B, and 1C also illustrate that when the temperature is raised in 12° to 14° increments, the heights of the peaks and hence the corresponding emission rates of the PFTs, were shown to be increased more than three-fold.

Figure 1B:
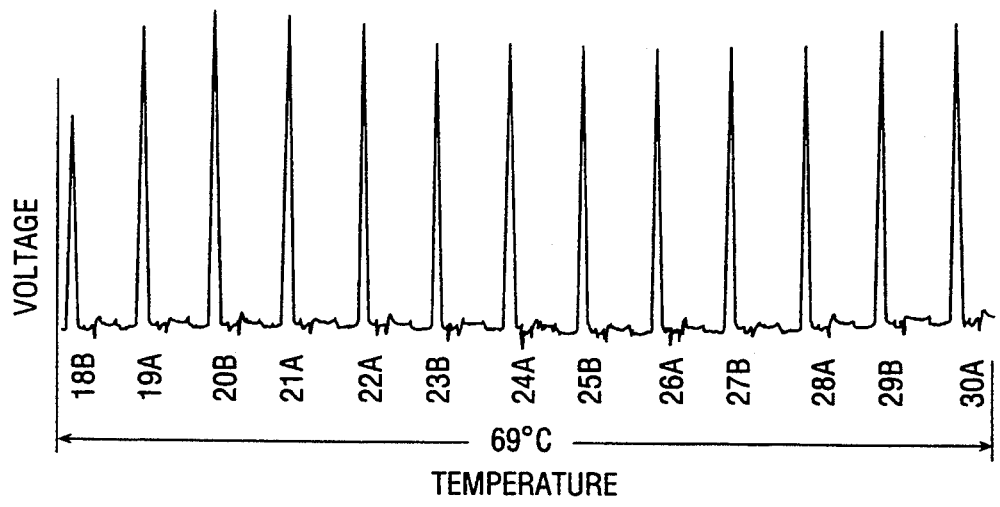
Figure 1C:
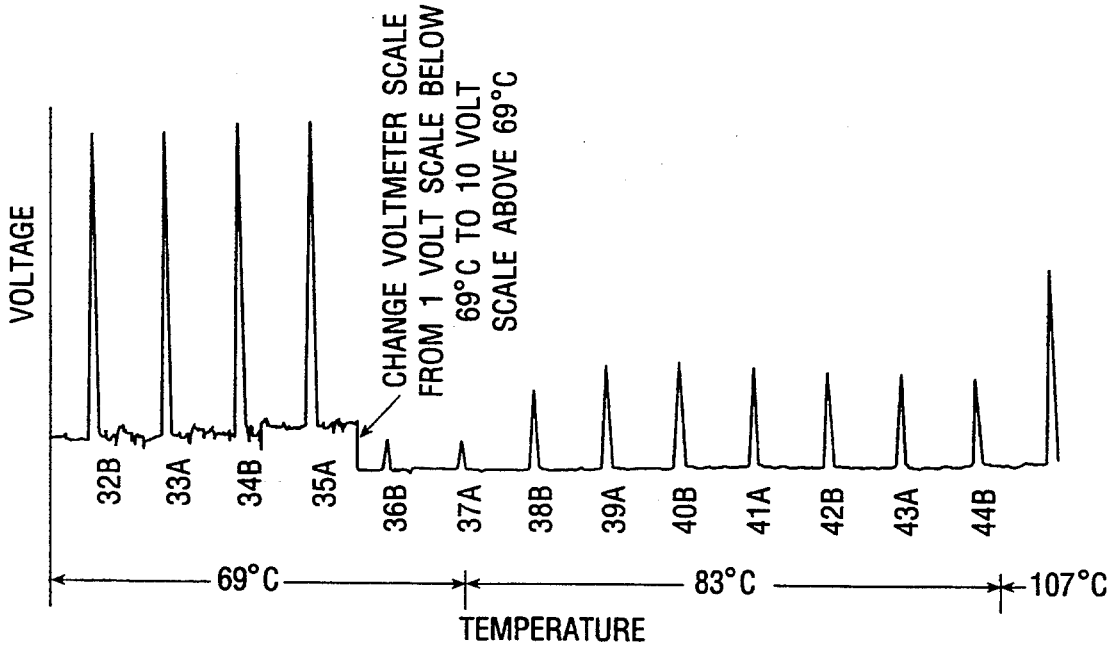

Table I contains the test results for each of the test runs identified by numbers in the Table and also by matching numbers in FIGS. 1A, 1B, and 1C. The chromatogram shown in FIG. 1C only illustrates the initiation of runs at 107° C., but the complete data taken at that temperature is shown only in Table 1 (not in FIG. 1C). Each of the respective test runs were performed, and resultant data taken, at six minutes intervals from the preceding and succeeding runs.

TABLE 1

| Run Number | Conditions | ocPDCH height, volts |
|---|---|---|
| 3A | Room temperature | Not detected |
| 4B | Room temperature | Not detected |
| 5A | Room temperature | Not detected |
| 6B | 10.1 volts applied, 42° C. | .018 |
| 7A | 10.1 volts applied, 42° C. | .032 |
| 8B | 10.1 volts applied, 42° C. | .038 |
| 9A | 10.1 volts applied, 42° C. | .042 |
| 10B | 10.1 volts applied, 42° C. | .038 |
| 11 | 12.6 volts applied, 55° C. | .098 |
| 12B | 12.6 volts applied, 55° C. | .132 |
| 13A | 12.6 volts applied, 55° C. | .136 |
| 14B | 12.6 volts applied, 55° C. | .142 |
| 15A | 12.6 volts applied, 55° C. | .140 |
| 16B | 12.6 volts applied, 55° C. | .137 |
| 17A | 15.2 volts applied, 69° C. | .347 |
| 18B | 15.2 volts applied, 69° C. | .486 |
| 19A | 15.2 volts applied, 69° C. | .512 |
| 20B | 15.2 volts applied, 69° C. | .508 |
| 21A | 15.2 volts applied, 69° C. | .490 |
| 22B | 15.2 volts applied, 69° C. | .465 |
| 23A | 15.2 volts applied, 69° C. | .460 |
| 24B | 15.2 volts applied, 69° C. | .460 |
| 25A | 15.2 volts applied, 69° C. | .455 |
| 26B | 15.2 volts applied, 69° C. | .455 |
| 27A | 15.2 volts applied, 69° C. | .460 |
| 28B | 15.2 volts applied, 69° C. | .470 |
| 29A | 15.2 volts applied, 69° C. | .482 |
| 30B | 15.2 volts applied, 69° C. | .488 |
| 31A | 15.2 volts applied, 69° C. | .490 |
| 32B | 15.2 volts applied, 69° C. | .490 |
| 33A | 15.2 volts applied, 69° C. | .490 |
| 34B | 15.2 volts applied, 69° C. | .501 |
| 35A | 15.2 volts applied, 69° C. | .50 |
| 36B | 15.2 volts applied, 69° C. | .50 |
| 37A | 18.5 volts applied, 83° C. | 1.28 |
| 38B | 18.5 volts applied, 83° C. | 1.69 |
| 39A | 18.5 volts applied, 83° C. | 1.68 |
| 40B | 18.5 volts applied, 83° C. | 1.72 |
| 41A | 18.5 volts applied, 83° C. | 1.55 |
| 42B | 18.5 volts applied, 83° C. | 1.50 |
| 43A | 18.5 volts applied, 83° C. | 1.40 |
| 44B | 22.5 volts applied, 107° C. | 3.14 |
| 45A | 22.5 volts applied, 107° C. | 3.50 |
| 46B | 22.5 volts applied, 107° C. | 2.84 |
| 47A | 22.5 volts applied, 107° C. | 2.22 |
| 48B | 22.5 volts applied, 107° C. | 1.72 |

Table II shows the averaged values for the Numbered Runs listed in Table I, at each corresponding listed temperature (except for 107° C.):

TABLE II

| Temperature Rate (°C.) | Volts | DTA picoliters | Calculated femtoliter/min-cm$_2$ | ocPDCH Emission |
|---|---|---|---|---|
| 42 | .039 | .236 | 28.8 | |
| 55 | .138 | .868 | 106 | |
| 69 | .492 | 3.51 | 428 | |
| 83 | 1.61 | 13.6 | 28.8 | |

From this test data several important features of the present invention were determined. First, the change in emission rate with temperature is shown to be relatively rapid, occurring within a minutes or so after a change in the applied voltage. Thus, it was concluded that it is probably the rate at which the resistor is thermally equilibrated which controls the rate of change of PFT emission rate. The important point is that the rate of change of emission rate is very responsive to temperature changes. Second, it is seen that at constant temperature, the emission rate of PFT is fairly constant, i.e., at about 69° C., as shown by the data in Table I, the Glyptal-composition-tagged resistor used in the experiments was able to emit constantly for up to two hours. Also, at 83° C. (see Table I) and certainly at 107° C., the ocPDCH is seen to be rapidly depleted.

Figure 2:
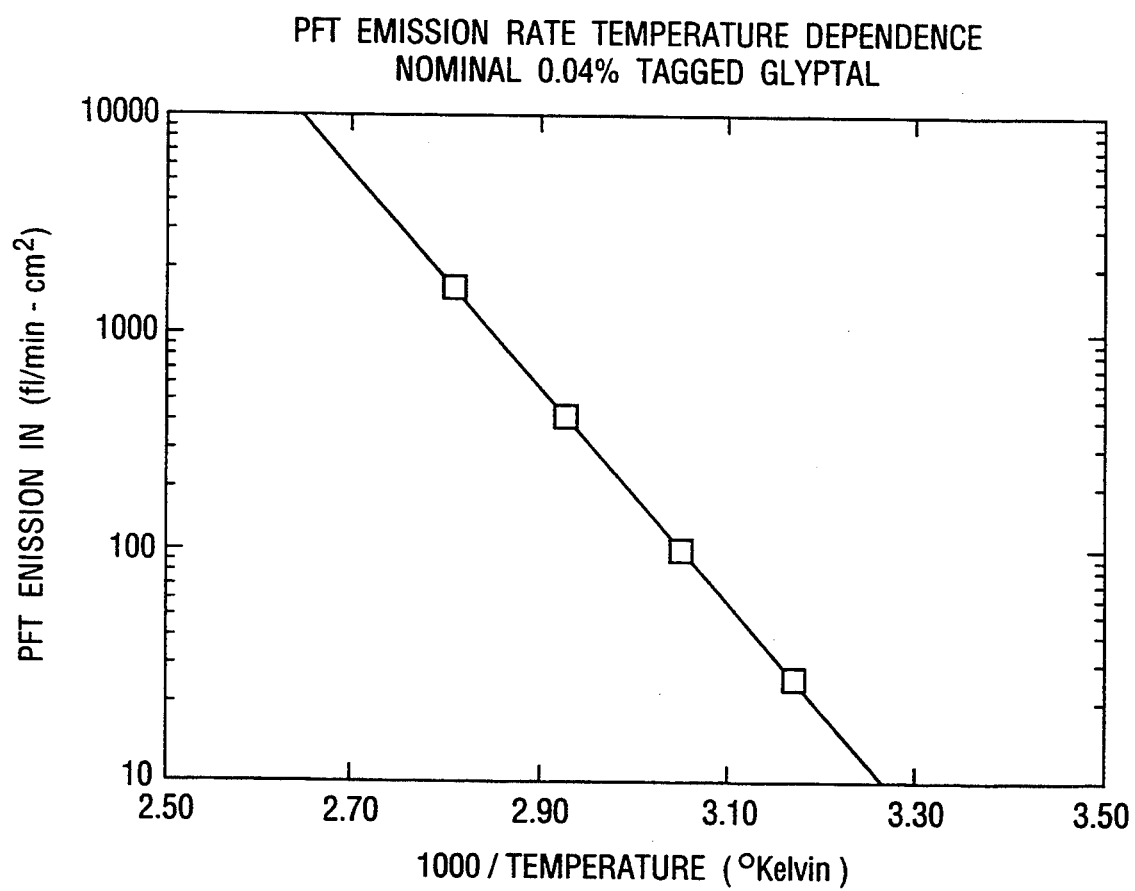
FIG. 2 is a graph showing PFT Emission Rate Temperature Dependence plotted against PFT Emission Rate.

The test data shown in FIG. 1, can be fitted according to an Arrhenius equation form which is expected for diffusion controlled processes. The results are shown in FIG. 2. The graph line in FIG. 2 is least square fitted as:

$$\ln \text{Rate (fL/min} - \text{cm}^2) = 38.53472 - \frac{22,045}{RT}, r^2 = 0.9918$$

From the fit shown in FIG. 2, it is possible to predict the PFT emission rate at several temperatures, as shown in Table III.

TABLE III

| T(°C.) | Predicted Rate, fL/min-cm$^2$ |
|---|---|
| 25 | 3.7 |
| 50 | 66.9 |
| 75 | 788.7 |
| 100 | 6,670 |
| 125 | 43,100 |

With an activation energy of 22 kcal per mole, the PFT emission rate increases quite rapidly, i.e., going from 25° C. to 50° C. it is seen to increase the PFT emission rate by almost twenty fold. From this test data, an estimate of the effective lifetime of a PFT tagged composition made according to the invention was made, assuming it would be operated at normal residence room temperature. It was assumed that no loss of PFT occurred during the initial drying process of the composition, thus the total initial loading for a 0.014% composition was 3 micrograms of ocPDCH. At the PFT emission rate of 3.7 fL (where fL=10$^{-15}$ liter)/-min-cm$^2$, or 21.1 fL/min for the 5.7 cm$^2$ area coating applied to the test resistor, it was determined that the estimated effective life for such a PFT tagged composition is approximately 17 years. On the other hand, it can be seen that if 90% of the PFT is lost from the composition during its initial drying, that would reduce the effective lifetime of the composition to about 2 years.

In practicing the present invention a number of suitable commercially available conventional carrier compounds can be used, instead of Glyptal paint. For example, other suitable carrier compounds with which PFTs can be compatibly mixed are conventional elastomeric film material, primary resin material, commercially available; conventional polymer materials and electrical insulating coating materials. In preparing such compositions, the amount of PFT mixed with the selected carrier compounds or materials should be in the range of about 0.1% to 0.19% by weight, based on the overall weight of the carrier compound. Also, the carrier compound should be curable by drying at about 21° C. and must be able to effectively entrap the PFT within the composition when it is maintained at about 21° C. Each of those compositions have been found to be effective to emit PFT vapor at an increasing rate as a direct function of increasingly high temperatures applied to the compositions, above about 42° C. and up to at least 83° C.

As mentioned above, the present invention is particularly useful in providing a method for readily localizing the sites of thermal overheating of a system or apparatus wherein such sites have been appropriately coated with one of more perfluoroites or PFT-containing compositions, so that different, separately identifiable PFT vapors will be emitted from the different compositions applied, respectively, to different sites in the system or apparatus. Table IV lists a number of suitable commercially available PFT tagging materials for such area-localizing applications.

TABLE IV

Perfluoro dimethylcyclobutane
Perfluoro methylcyclopentane
Perflouro methylcyclohexane
Perfluoro 1,2 dimethylcyclohexane
Perfluoro 1,3 dimethylcyclohexane
Perfluoro 1,4 dimethylcyclohexane
Perfluoro 1,3,5 trimethylcyclohexane From the foregoing description of the invention it should be apparent that it can be successfully applied to a number of different applications, such as for coating portions of electrical or electronic components in critical instruments such as those used in space shuttles or medical equipment, as well as those used in electrical generating or power-using apparatus that is subjected to overheating conditions. Also, the invention is useful for coating electronic circuitry such as insulating-resin coated circuit boards of the type used in electronic apparatus that must be monitored to assure early detection of possible thermal degradation of the insulating system or of the overheating of portions of the coated circuit. In particular, the invention is useful in providing early pre-fire or pre-charring warnings for electronic circuits of the type that are used in outer space vehicles, where system reliability is critical.

We claim:

1. A thermal overheat indicating apparatus or system comprising a plurality of electrical or electronic components each of which is coated with a composition said composition comprising a perfluorocarbon tracer material mixed, with a non-reactive carrier compound taken from the group consisting of glyptal paint, elastomeric film material, primary resin material, polymer material and electrical insulating coating material, wherein the amount of perfluorocarbon tracer is in the range of about 0.1% to 0.19% by weight, based on the overall weight of the carrier compound in the composition, said carrier compound being curable by drying at about 21° C. or less, said composition being effective to emit an essentially perfluorocarbon tracer gaseous vapor thereform at an increasing rate as a function of increasingly higher temperatures applied to the composition above 42° C., with the coating composition for certain different components being tagged by being made to contain different, separately identifiable perfluorocarbon tracer as tagging materials, and wherein the apparatus or system includes a perfluorocarbon tracer detector or detectors for detecting and identifying the different perfluorocarbon tracer tagging materials when emitted as essentially gaseous vapors from the different components of the system responsive to the components being heated in excess of 42° C., whereby the locations of such overheating can be readily identified by determining which of the different perfluorocarbon tracer tagging materials are detected and identified by the detector or detectors then correlating the detected perfluorocarbon tracer tagging materials with the identity of the given compositions applied as a coating on the respective coated components.

2. An invention as defined in claim 2 wherein each of said perfluorocarbon tracer tagging materials is taken from the group consisting of; perfluoro dimethylcyclobutane, perfluoro methylcyclopentane, perfluoro methylcyclohexane, perfluoro 1,2 dimethylcyclohexane, perfluoro 1,3 dimethylcyclohexane, perfluoro 1,4 dimethylcyclohexane, and perfluoro 1,3,5 trimethylcyclohexane.

3. An invention as defined in claim 2 wherein each of said tagging materials comprises either one of the group of tagging materials in claim 2 or a mixture of two or more of the tagging materials taken from the group in claim 2, whereby up to 128 different components coated with different mixtures of said tagging materials can be separately identified by the perfluorocarbon tracer detector or detectors, thereby to identify and localize the respective coated component or components from which the perfluorocarbon tracer tagging materials are emitted responsive to said components being heated above a critical predetermined temperature.

4. A method for locating thermal overheating of components of an electrical or electronic system or apparatus comprising the steps of preparing a plurality of different compositions, each of said compositions comprising a perfluorocarbon tracer material mixed with a non-reactive carrier compound taken from the group consisting of glyptal paint, elastomeric film material, primary resin material, polymer material and electrical insulating coating material, wherein the amount of perfluorocarbon tracer is in the range of about 0.1% to 0.19% by weight, based on the overall weight of the carrier compound in the composition, said carrier compound being curable by drying at about 21° C. or less, each of said compositions further being effective to emit an essentially perfluorocarbon tracer gaseous vapor therefrom at an increasing rate as a function of increasingly higher temperatures applied to the composition above 42° C., applying the different compositions respectively to separate components of the electrical or electronic system or apparatus as coatings thereon, providing one or more detector(s) to monitor emissions from the compositions into the ambient liquids on fluids around said components or apparatus, applying electric power to the electrical apparatus or system and monitoring the perfluorocarbon tracer detected and identified by the detector(s), thereby to identify any apparatus or component of the coated system that is sufficiently overheated to cause the perfluorocarbon tracer in the composition coating it to be emitted in significant volume as essentially a gaseous vapor into the ambient or air stream surrounding the coated system or apparatus.

5. A thermal overheat indicating apparatus or system comprising a plurality of electrical or electronic components each of which is coated with a composition comprising a perfluorocarbon tracer material mixed with a non-reactive carrier compound, with the coating composition for certain different components being tagged by being made to contain different, separately identifiable perfluorocarbon tracer as tagging materials, and wherein the apparatus or system includes a perfluorocarbon tracer detector or detectors for detecting and identifying the different perfluorocarbon tracer tagging materials when emitted as essentially a gaseous vapor from the different components of the system responsive to the components being heated in excess of 42° C., whereby the locations of such overheating can be readily identified by determining which of the different perfluorocarbon tracer tagging materials are detected and identified by the detector or detectors then correlating the detected perfluorocarbon tracer tagging materials with the identity of the given compositions applied as a coating on the respective coated components.

6. A method for locating thermal overheating of components of an electrical or electronic system or apparatus comprising the steps of preparing a plurality of different compositions, each of said compositions comprising a perfluorocarbon tracer material mixed with a non-reactive carrier compound, wherein each of said compositions contains a different readily identifiable perfluorocarbon tracer, applying the different compositions respectively to separate components of the electrical or electronic system or apparatus as coatings thereon, providing one or more detector(s) to monitor emissions from the compositions into the ambient liquids on fluids around said components or apparatus, applying electric power to the electrical apparatus or system and monitoring the perfluorocarbon tracer detected and identified by the detector(s), thereby to identify any apparatus or component of the coated system that is sufficiently overheated to cause the perfluorocarbon tracer in the composition coating it to be emitted in significant volume as essentially a gaseous vapor into the ambient or air stream surrounding the coated system or apparatus.

* * * * *